United States Patent [19]

Grossman

[11] Patent Number: 5,352,911

[45] Date of Patent: Oct. 4, 1994

[54] DUAL BASE HBT

[75] Inventor: Peter C. Grossman, Manhattan Beach, Calif.

[73] Assignee: TRW Inc., Redondo Beach, Calif.

[21] Appl. No.: 783,303

[22] Filed: Oct. 28, 1991

[51] Int. Cl.$^5$ ............... H01L 29/161; H01L 29/205; H01L 29/72

[52] U.S. Cl. ................. 257/198; 257/191; 257/582; 257/583; 257/584; 257/586; 257/591; 257/592; 307/299.1; 307/303

[58] Field of Search ............ 257/191, 197, 198, 582, 257/583, 584, 586, 591, 592, 307/303, 299.1

[56] References Cited

U.S. PATENT DOCUMENTS

| 4,768,074 | 8/1988 | Yoshida et al. | 257/198 |
| 4,794,440 | 12/1988 | Capasso et al. | 257/198 |
| 4,979,009 | 12/1990 | Kusano et al. | 257/197 |
| 4,996,166 | 2/1991 | Ohshima | 357/198 |
| 5,027,179 | 6/1991 | Yokoyama et al. | 257/198 |

FOREIGN PATENT DOCUMENTS

| 60-10775 | 1/1985 | Japan | 357/34 HB |
| 1-108770 | 4/1989 | Japan | 357/34 HB |

OTHER PUBLICATIONS

R. L. Wallace, Jr., L. C. Schmidt, & E. Dicken, "A Junction Transistor Tetrode for High-Frequency Use", Chapter 7, Tetrodes published in Proc. IRE, vol. 40, No. 1952.

*Primary Examiner*—Ngan Ngo

[57] ABSTRACT

This invention discloses a dual base heterojunction bipolar transistor for use in a number of different application. Current is introduced into one of the base contacts such that current is forced through the base region of the transistor to the other base contact. Because of the different resistances in the base, there will be a voltage potential between one side of the emitter mesa adjacent one of the base contacts and the other side of the emitter mesa adjacent the other base contact. This lateral voltage potential creates current crowding which forces the current density to travel to the perimeter of the transistor. Because the current travels mostly through the perimeter regions of the transistor, this concept can be used for testing for defects in the bulk of the base region by comparing the current gain without current crowding and with current crowding. Also, this concept can be used strictly as a gain control for a heterojunction bipolar transistor.

7 Claims, 3 Drawing Sheets

DUAL BASE HBT

BACKGROUND OF THE INVENTION

1. Field of the Invention:

This invention relates generally to a heterojunction bipolar transistor, and more particularly, to a heterojunction bipolar transistor incorporating separate dual base contacts for producing desirable current crowding.

2. Background of the Related Art

Transistors which are formed, at least in part, by one or more p-n junctions, in which the p-type and n-type semiconductor regions are of the same material, are generally referred to as homojunctions. Transistors which are formed of at least one p-n junction from semiconductor regions of dissimilar materials are generally referred to as heterojunctions. Because of the discontinuity of the energy band gaps of the two dissimilar materials, a heterojunction transistor exhibits a number of characteristic properties not found in their homojunction counterpart. Specifically, higher doping of the base region can be realized in a heterojunction transistor, thus reducing base resistance. Because of this, heterojunction transistors typically have use in a number of different applications.

A bipolar transistor typically is formed of two closely configured p-n junctions. For a heterojunction bipolar transistor (HBT) either of the materials forming the junctions can be dissimilar, however, it is the more conventional practice to have at least the emitter region and base region to be of the dissimilar materials. For bipolar transistors of this type, the conventional device generally includes a single conductive emitter contact, a single conductive collector contact and dual conductive base contacts formed on opposite sides of the emitter contact. Although there are usually two base contacts surrounding the emitter contact in the conventional HBT, the base contacts are electrically connected on the surface of the semiconductor block forming the bipolar transistor and are in essence a single contact.

The phenomenon known as current crowding in a transistor is conceptually defined as a higher current density near the edges of the base region of the transistor caused by a lateral voltage drop in the base region due to the base resistance. Because the current is forced into a particular area of the base region, the effective area of the active transistor region is generally reduced in an undesirable fashion. Consequently, certain design constraints on the transistor known in the art are implemented to reduce current crowding in the conventional bipolar transistor. Therefore, the effects of current crowding generally are not a major concern in the operation of a conventional HBT.

A reference disclosing a dual base homojunction bipolar transistor is acknowledged in the prior art. Specifically, in the article Wallace, "A Junction Transistor Tetrad For High-Frequency Use", *Proceedings of the IRE*, Vol. 49, November 1952, the authors disclose a separate dual base homojunction bipolar transistor in which the base resistance of the transistor is reduced due to the effects of current crowding. The object of this design was to reduce the path length of the current in the device, and thus, enable the transistor to operate at much higher frequencies.

As mentioned above, base resistance generally causes problems in effective transistor use. Additionally, as mentioned, base resistance limits the maximum frequency of operation of an HBT. Defects within the semiconductor material, whether they be surface defects or bulk defects, decrease the current gain of the transistor. Consequently, a method of determining where the defects exist at the development stage as a quality control step would increase the reliability of operation of the transistor in the marketed product.

Prior art methods of determining the location of defects in an HBT exist typically require testing of groups of different sized devices at the end of the manufacturing stage. By testing a group of simultaneously grown semiconductor devices, it is possible to determine the current characteristics of the entire batch. Since the accuracy of this type of test is generally effected by semiconductor devices having widely varying areas, it is necessary to test a group of the devices to localize defects. Consequently, the method of testing is inefficient in that a large number of tests must be performed to determine the location of the defects in a group of devices. Further, there is no way, from electrical measurement of a single device alone, to determine if defects in transistors are a surface or bulk phenomenon.

What is needed then is a method of determining defects in a semiconductor device without requiring a wide range of test devices. It is one object of this invention to utilize the phenomena of current crowding in an HBT to localize defects in the HBT. It is stressed, however, that inducing current crowding in an HBT has other applications as will become apparent.

SUMMARY OF THE INVENTION

This invention discloses a method for inducing current crowding in, particularly, but not exclusively, a heterojunction bipolar transistor for use in a number of specific applications. To induce current crowding in the HBT, separate base contacts are incorporated on opposite sides of the emitter mesa, in one preferred embodiment. Current is then forced through the base region of the HBT from one base contact to the other base contact. The induced current will cause a voltage drop due to the resistance in the base region along the entire width of the emitter mesa. Because the current density of the HBT is exponentially dependent on the voltage drop across the base-emitter space charge region, the side of the base region with the higher base-emitter voltage potential will carry more current. Further, the emitter side of the base-emitter space charge region will be at a constant potential because there will be negligible lateral current flow in the emitter region.

Because the current in the base region of the HBT is forced to one edge of the emitter mesa, little current will flow in the bulk of the base region. If the current density forced to the edge of the emitter mesa by current crowding causes the overall current gain to increase, then the current gain was limited by a defect in the bulk base region in the absence of the forced current under normal operation. If the current density forced to the edge of the emitter mesa reduces the overall current gain, then the bulk of the base region did not have a substantial defect, or the current gain is limited by excessive surface current. Consequently, it is possible to reliably determine if a p-n junction transistor, regardless of its comparative size, includes any substantial defects within its bulk region. It is noted that this procedure has application to all bipolar transistors including both homojunction and heterojunction bipolar transistors. Therefore, current crowding can be used as a diagnostic test for bipolar transistors.

Forced current crowding in a HBT also has other applications. Specifically, optical emissions from an HBT is a known useful characterization method. Optical emission occurs when an electron within the semiconductor device is forced into a region where it may recombine with a hole at a lower energy level. This process emits a photon of energy approximately equal to the electron-hole energy difference. Without forced current crowding, most of the emitted light from the recombination of electrons in the base-emitter space charge region is reabsorbed by the device before it can be emitted from the transistor. If this light emission were mostly confined to an area near the surface of the device, more of the emitted light would escape and be available for detection. Since current crowding causes the active region of the base to be confined along its edges, a large increase in the optical emission of the device is realized. Consequently, an HBT under current crowding will act better as a spectral analysis device than its conventional counterpart.

A further application of forced current crowding in an HBT is the use of such a device as a gain control. Since the current gain of an HBT is dependent on the current density through the base region, the lateral current flow through the base region causing current crowding can be used as a way of controlling the gain of the transistor by varying the effective current density.

Additional objects, advantages, and features of the present invention will become apparent from the following description and appended claims, taken in conjunction with the accompanying drawings.

DETAILED DESCRIPTION OF THE DRAWINGS

The following description of the preferred embodiments is merely exemplary in nature and is in no way intended to limit the invention or its application or uses.

Figure 1:
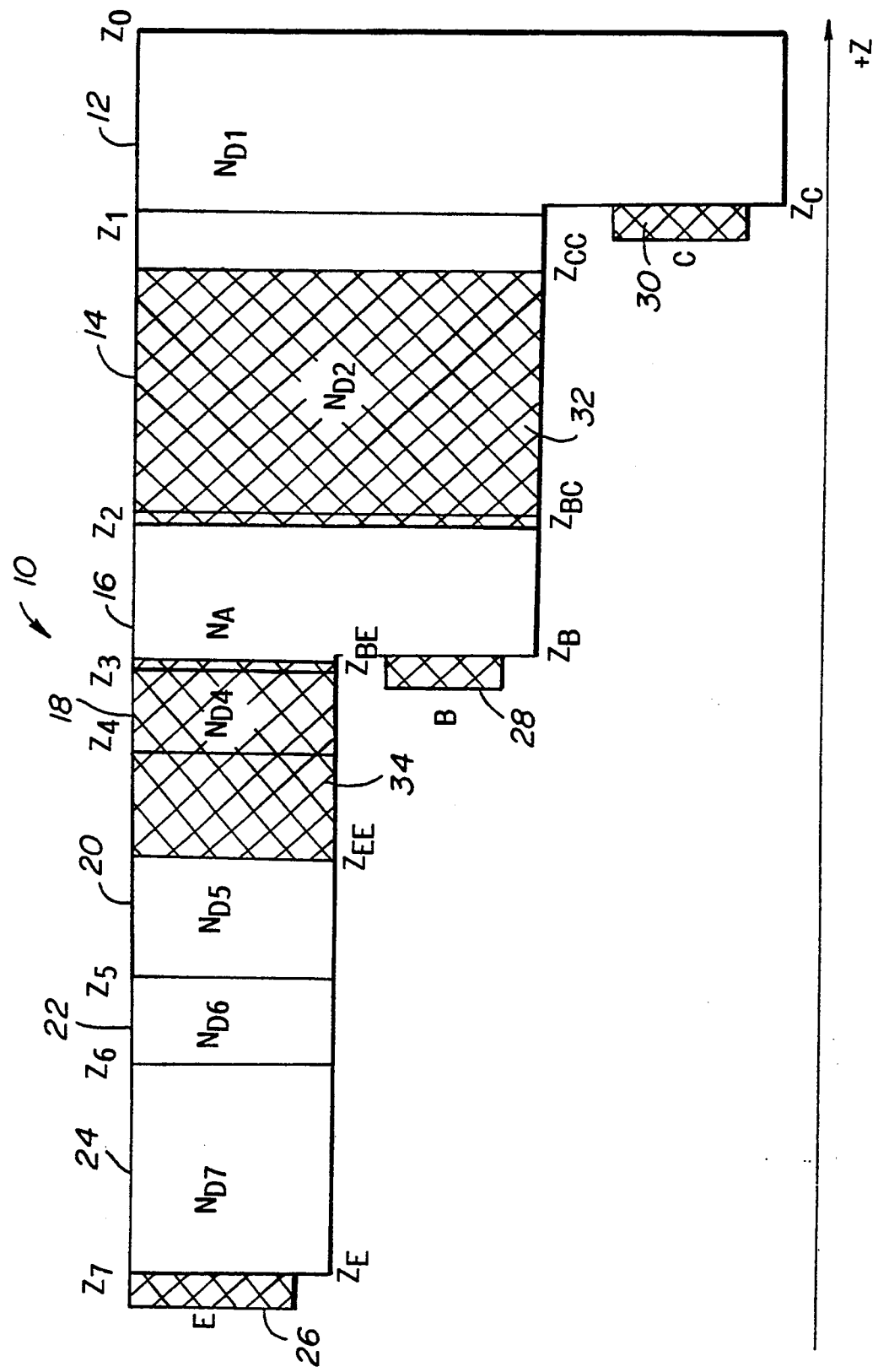
FIG. 1 is a layer definition of bipolar transistor.

FIG. 1 shows a layer representation of a typical bipolar transistor. In this diagram $Z_n$ is a height representation of the transistor as it is grown by an epitaxial process. Further, $N_n$ represents the doping concentration of each layer. Epitaxial growth processes, such as molecular beam epitaxy, are known in the art for arranging desirable semiconductor atoms in a crystalline fashion upon a substrate. Generally, epitaxial growth involves introducing a stream of desirable atoms into a chamber such that the atoms are adhered to the substrate and are grown in thickness as desired. As different atoms are added into the stream, the different layers are grown accordingly. Other methods are also known in the art for producing a transistor of this type.

Returning to FIG. 1, a transistor structure 10 represents a grown N-P-N bipolar transistor. Specifically, a bottom collector contact layer 12 is first developed on a substrate (not shown) to a desirable thickness, here $Z_1$. This N-type layer is grown with a heavy doped donor atom concentration of $N_{D1}$. Sometimes collector contact layer 12 will be considered the substrate on which the following layers are grown. The next layer grown is a lightly doped collector layer 14. Layer 14 is grown on top of layer 12 to a height of $Z_2$ and has a lightly doped donor concentration of $N_{D2}$. Consequently, the thickness of the lightly doped collector layer 14 is $Z_2$-$Z_1$, as shown. The next layer grown on top of layer 14 is base layer 16. Base layer 16 is a P-type layer and has a high dopant concentration of $N_A$ acceptor atoms. Layer 16 is grown to a height of $Z_3$ and thus, has a thickness of $Z_3$-$Z_2$. Grown on top of base layer 16 is an emitter graded layer 18. Emitter graded layer 18 has a thickness of $Z_4$- $Z_3$ and a dopant concentration of $N_{D4}$ donor atoms. Grown on top of emitter graded layer 18 is a wide band gap emitter layer 20. Wide band gap emitter layer 20 has a thickness of $Z_5$-$Z_4$ and an N-type dopant concentration $N_{D5}$ of donor impurity atoms. Grown on top of band gap emitter layer 20 is emitter contact graded layer 22. Emitter contact graded layer 22 has a thickness of $Z_6$-$Z_5$, and an N-type dopant concentration of $N_{D6}$ impurity donor atoms. Grown on top of emitter contact graded layer 22 is emitter contact layer 24. Emitter contact layer 24 has a thickness of $Z_7$-$Z_6$, and a N-type doping concentration of $N_{D7}$ donor impurity concentration. Layer 24 represents a top layer of the semiconductor device. A P-N-P type bipolar transistors would be very similar to structure 10 having opposite dopant concentrations. A heterojunction bipolar transistor would have at least dissimilar emitter and base materials as will be described in more detail below.

Once each of the layers discussed above is grown, the just formed bipolar transistor 10 is then etched. First a conductive contact layer representing an emitter contact 26 is formed on top of emitter contact layer 24 by well known means. The value $Z_E$, the height of emitter contact 26, represents the top of the emitter mesa as will be described below. Once this is accomplished, layers 24, 22, 20, 18 and 16 are etched down to a height of $Z_B$, as shown. $Z_B$ is the top of the base mesa as will be described below, and is slightly less than level $Z_3$. It thus extends slightly into base layer 16. At level $Z_B$ a conductive base contact 28 is formed onto base layer 16. Layers 16, 14 and 12 are then etched down to a level of $Z_C$ to form a region for a conductive collector contact 30 to be adhered to on collector contact layer 12. Level $Z_C$ is slightly less than level $Z_1$ such that the collector contact 30 extends slightly into collector contact layer 12. The shaded region 32 represents the base-collector space charge region and shaded region 34 represents the base-emitter space charge region, both of which are formed by the combination of p-type and n-type materials forming a n-p junction, as is well known in the art. As is apparent from FIG. 1, base-collector space charge layer 32 is developed mostly within slightly doped collector layer 14 to a level of $Z_{CC}$ and extends slightly into base layer 16 to a level of $Z_{BC}$. Likewise, base-emitter space charge layer 34 covers the entire emitter graded layer 18 and extends partially in wide band gap emitter layer 20 to a level of $Z_{EE}$, but also extends somewhat into base layer 16 to a level of $Z_{BE}$. The width of both space charge regions 32 and 34 is dependent upon the biases which are placed between the emitter and base contacts 24 and 26 and the base and collector contacts 26 and 28. Therefore, levels $Z_{EE}$, $Z_{BE}$, $Z_{BC}$ and $Z_{CC}$ are variable under different voltage applications, as is well known in the art. In a heterojunction bipolar transistor, the base layer 16 will be of a different material than the emitter layers 18, 20 and 22.

Figure 2:
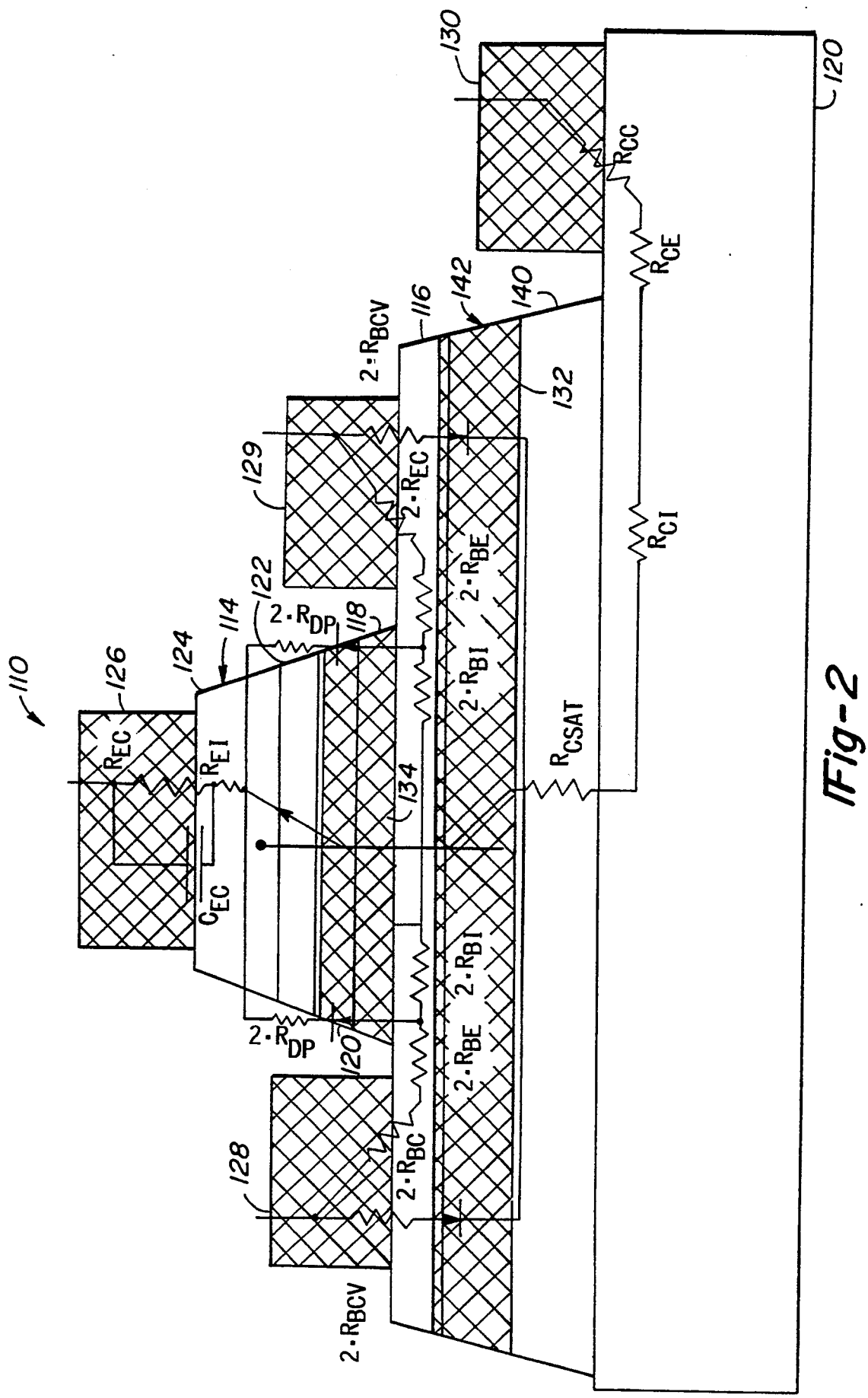
FIG. 2 is a sectional view of an HBT, according to one preferred embodiment of the present invention, including a superimposed circuit over the HBT.

Now turning to FIG. 2, an HBT 110, according to one preferred embodiment of the present invention, is shown in a side view. Also, a circuit is shown superimposed on HBT 110 to show at least the different resistances between different layers and regions of HBT 110. It is noted that HBT 110 includes the same layers as the bipolar structure 10 of FIG. 1. For this reason, like layers have the same reference numerals preceded by a "1". Also, FIG. 1 can represent either a homojunction bipolar transistor or a heterojunction bipolar transistor, whereas FIG. 2 shows an HBT. In FIG. 2, HBT 110 is arranged according to a more traditional configuration.

HBT 110 includes a collector contact layer 120 which has a base mesa 142 and a collector contact 130 formed on top of it by the process described above. Base mesa 142 is comprised of a lower lightly doped collector layer 140 and a base layer 116. The base collector space base-charge region 132, shown shaded, is formed mostly in the lightly doped collector layer 140 but travels slightly into base layer 116. Formed on top of base mesa 142 is an emitter mesa 114 in a center position and two base contacts 128 and 129 on opposite sides of emitter mesa 114. Emitter mesa 114 is comprised of an emitter graded layer 118 in contact with base layer 116 and a wide band gap emitter layer 120 in contact on top of emitter graded layer 118. An emitter graded contact layer 122 is formed on top of the wide band gap layer 120 and an emitter contact layer 124 is formed on top of the emitter contact graded layer 122. Formed on top of emitter contact layer 124 is emitter contact 126, as shown. The base-emitter space charge layer 134, shown shaded, includes all of emitter graded layer 118 and a part of the wide band gap emitter layer 120. All of the layers are formed to each other by an epitaxial growth process as discussed above, but it will be understood that this is just an example and other configurations and manufacturing techniques can be employed without departing from the spirit of the invention.

In the specific example of FIG. 2, HBT 110 has a $Ga_{1-x}Al_xAs$ emitter region and a GaAs base and collector region having special concentrations and doping characteristics. Specifically, the collector contact layer 120 is GaAs and is doped with $N_{D1}$ donor impurity atoms of silicon at $5 \times 10^{16}$. The lightly doped collector layer 140 is GaAs and is doped with $N_{D2}$ donor impurity atoms of silicon at $5 \times 10^{15}$. The base layer 116 is GaAs and is doped with $N_A$ impurity acceptor atoms of beryllium at $1 \times 10^{19}$. The emitter graded layer 118 is $Ga_{1-x}Al_xAs$ and is doped with $N_{D4}$ donor impurity atoms of silicon at $5 \times 10^{17}$, and the value of X is graded to be 0.02 at the contact area of layer 116 and 0.3 at the contact area of layer 120. The wide band gap emitter layer 120 is $GA_{1-x}Al_xAs$ and is doped with $N_{D5}$ donor impurity atoms of silicon at $5 \times 10^{17}$, where X is equal to 0.3. The emitter graded contact layer 122 is $Ga_{1-x}Al_xAs$ and is doped with $N_{D6}$ impurity donor atoms of silicon at $5 \times 10^{17}$, where X is graded to be 0.3 at the contact area of layer 120, and 0.2 at the contact area of layer 124. The emitter contact layer 124 is GaAs and is doped with $N_{D7}$ donor impurity atoms of silicon at $7 \times 10^{16}$. It is again noted that this is just an example and other materials, concentrations and doping can be substituted without departing from the spirit of the invention.

The superimposed circuit on HBT 110 shows some of the resistance values which would be encountered if the normal bias potentials were applied to the appropriate contacts, as is well known in the art. Other resistive values are known, but are considered negligible under normal operation. Each resistor value has a multiplication factor of two due to the fact that, according to a preferred embodiment, each of the base contacts 128 and 129 are electrically separate from each other creating separate current flow. Specifically, the resistance value $R_{BCV}$ is a vertical base collector resistance which is exhibited by a voltage potential between the base contacts 128 and 129 and collector contact 130. The resistance value $R_{BC}$ is a lateral base contact resistance to the base current flowing normal to the emitter current. The resistance value $R_{BE}$ is a bulk ohmic extrinsic base resistance between the base contacts 128 and 129 and the emitter mesa 114. The resistance value $R_{BI}$ is a spreading resistance from the resistance to current flow in the base region under the emitter mesa 114.

The resistance value $R_{EC}$ is the vertical emitter contact resistance from the resistance of the emitter contact 126 to current flow normal to the contact surface. The resistance value $R_{EI}$ is the bulk ohmic intrinsic emitter resistance between the edge of the space charge region 134 closest to the emitter region and the emitter contact 126. The resistance $R_{EP}$ is the emitter perimeter resistance from the base-emitter perimeter recombination proximate to the emitter space-charge region 134.

The resistance $R_{CSAT}$ is a bulk ohmic resistance between the collector edge of the space-charge region 132 and the collector contact 130. The resistance $R_{CI}$ is the a collector spreading resistance to current flow in the collector region under the base mesa 142. The resistance $R_{CE}$ is a bulk ohmic extrinsic collector resistance between the collector contact 130 and the base mesa 142. The resistance $R_{CC}$ is a lateral collector contact resistance to the current flowing laterally normal to the emitter current.

Each of the diodes represents the perimeter recombination direction in the base. The capacitance $C_{EC}$ is the capacitance between the emitter region and collector region as is well known in the art. Lattice defects in the semiconductor materials increases the above resistances, generally in an undesirable fashion since they oppose current flow. Since the base contacts are separate in a preferred embodiment of the present invention, the resistances of $R_{BC}$, $R_{BE}$, $R_{BI}$ and $R_{BCV}$ will be effected by defects in the base region differently from one side of the emitter mesa 114 to the other side. Accordingly, current crowding can be used to isolate these defects.

As is apparent from above, a number of resistances impede the flow of current through a bipolar transistor. A heterojunction bipolar transistor allows the base region to be doped higher than the emitter region. This increased doping enables the base to be more conductive, and thus, decreases the effects of the resistances of the base region. Further, the narrow band gap GaAs layer enables the base emitter p-n junction to have a better ohmic contact. Likewise, the GaAs emitter contact layer 124 also makes use of the narrow band gap to make good contact with the adjacent materials, specifically, conductive emitter contact 126 and emitter graded contact layer 122.

In operation of the HBT 110, a current source (not shown) is connected to one of either base contacts 128 or 129. The current is forced through base layer 116 to the opposite base contact. The forced current causes a lateral voltage drop between the areas of the base layer 116 below each of the base contacts 128 and 129 and the emitter mesa 140 because of the differences in resistance of the bulk base material. The difference in the lateral voltage drop causes the current density to increase (current crowding) near the perimeters of the base layer 116.

The ability to control the current density in the base region gives an HBT having this property a number of desirable characteristics. Specifically, by altering the current density through the base layer 116, it is possible to control the gain of the transistor in an amplification capacity. By adjusting the current forced between the base contacts 128 and 129, it is possible to control the amount of current passing through the base region and thus control the current flow of the transistor. There is a wide variety of applications in which it would be desirable to control the gain of the transistor in this manner.

Further, since it is possible to control the current flow in the transistor, it is possible to use the current crowding technique as a means of testing the transistor. Since little current will flow in the bulk region of the base layer 116 under sufficient current crowding, then if forcing the current to the edge of the emitter mesa 114 causes the current gain to increase, the current gain was limited by a bulk defect. If the forced current flow to the edge of the emitter mesa 114 reduces the current gain, as would be expected since there is less room for the current to flow, the device probably does not have a sufficient defect in the bulk region.

A further application comes in the use of a bipolar transistor as a device for measuring the spectral intensity emitted from the transistor. In certain applications, well known to those skilled in the art, a heterojunction bipolar transistor will emit light which can be measured to determine the characterization of the transistor. Typically, the light is emitted from the bulk region of the transistor, and thus, a substantial amount of recombination of the generated light occurs before the light is able to be released from the transistor. Under current crowding, since there is little current flow in the bulk region most of the emitted light will come from the perimeter areas, and consequently, there is less chance that the light will be reabsorbed before being emitted by the transistor. Therefore, in a spectral intensity application, more light will be emitted from the transistor raising its efficiency to such a procedure.

Figure 3:
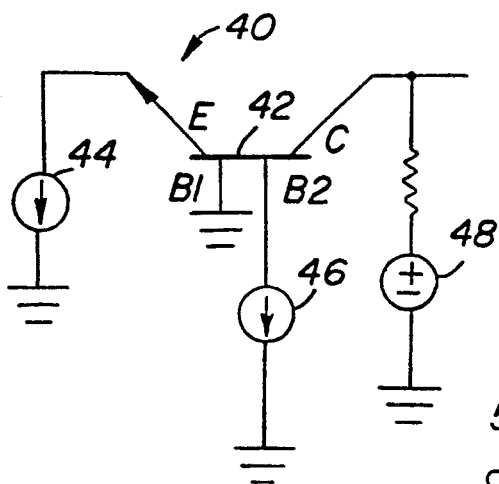
FIGS. 3-5 are circuit diagrams showing different applications of an HBT according to one preferred embodiment of the present invention.
Figure 4:
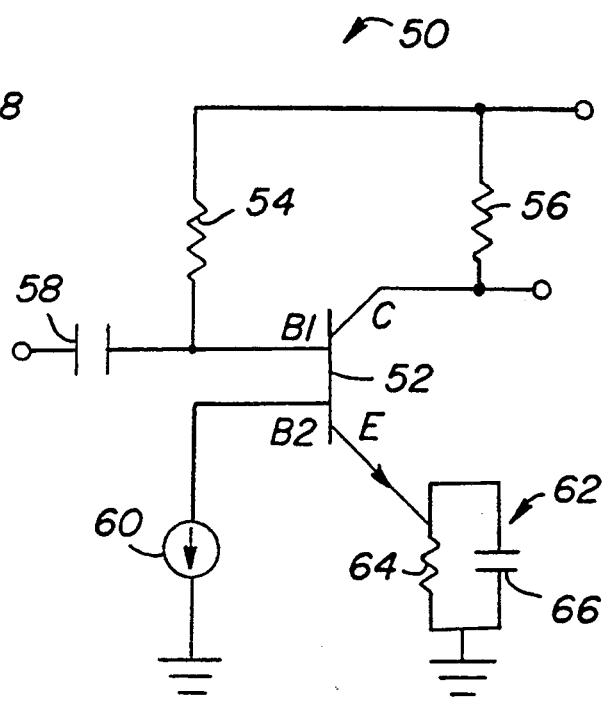
Figure 5:
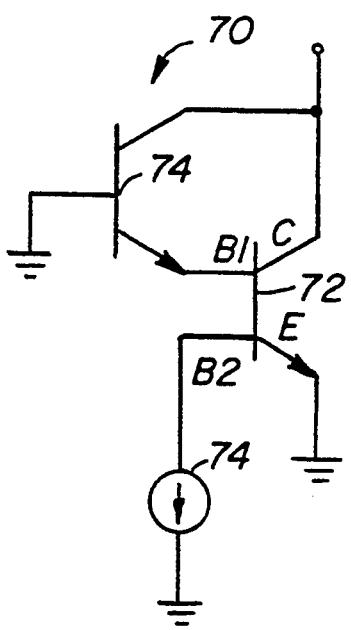

FIGS. 3–5 show specific applications of the dual base HBT according to the invention. FIG. 3 shows a common base amplifier for use as a DC test circuit 40 incorporating a dual base HBT 42, according to one preferred embodiment of the present invention. As is apparent, HBT 42 includes a forward biased emitter terminal labeled E, two base terminals $B_1$ and $B_2$, and a collector terminal C. Connected to the emitter terminal E is an emitter current source 44 acting as an input signal and forward biased to the emitter of transistor 42. A voltage source 48 is connected to the collector terminal of transistor 42 to provide a collector-base potential as is well known in the art. Base contact $B_1$ is grounded and base contact $B_2$ has a current source 46 applied to it according to the invention.

As discussed above, forcing current into one base terminal of HBT 42 by current source 46 will create current crowding in the base region due to the voltage drop created by the base resistance. By inducing the current crowding in transistor 42 by means of current source 46, transistor 42 can be tested for defects by measuring the current gain with and without the current source 46 and comparing the two. In addition, a circuit 40 of this type can be functional in that it can act as an amplifier with a variable gain. Specifically, by adjusting source 46, the gain of circuit 40 will be altered.

FIG. 4 discloses a common emitter amplifier circuit 50. Amplifier circuit 50 includes an HBT 52 having a forward biased emitter terminal E, a collector terminal C, and two base terminals $B_1$ and $B_2$. As is known in the art, common emitter amplifiers such as the type disclosed in FIG. 4, include a VCC collector voltage applied to the base and collector terminals through resistors 54 and 56, as shown. An output signal will be taken from the base contact $B_1$ through a capacitor 58. An RC circuit 62 comprised of resistor 64 and capacitor 66 sets a time signal for the amplifier circuit 50 and thus acts as a biasing circuit for setting the operating potential. A current source 60 connected to base terminal $B_2$ induces the current crowding as discussed above such that the gain of the amplifier circuit 50 can be controlled. By altering the current in the base terminal $B_2$, the output signal at base terminal $B_1$ will be proportionally adjusted. If the gain is to be set at a constant level, current source 60 can be replaced with a resistor and the current crowding will be induced by the VCC input signal.

FIG. 5 shows a biased base heterojunction bipolar transistor (BBHBT) 70 which makes use of the dual base current crowding technique as discussed above. BBHBT 70 actually includes two bipolar transistors 72 and 74 acting together as a single bipolar transistor. Transistor 72 is an HBT and includes dual base contacts $B_1$ and $B_2$, collector contact C and emitter contact E. Base contact $B_2$ is connected to a constant current source 74 for providing the current crowding. Base contact $B_1$ of HBT 72 is connected to a forward biased emitter contact of the second bipolar transistor 74. In FIG. 5, the collector contact of transistor 74 is connected to the collector contact of HBT 72.

This configuration allows the gain of circuit 70 to go to voltage saturation plus the turn-on voltage of HBT 72 at the low end. By disconnecting the collector of transistor 74 from the collector of HBT 72 and applying a bias to the collector of transistor 74, the minimum voltage will be the saturation voltage. BBHBT 70 will have a higher bulk current gain compared to the same sized conventional HBT. In addition, a lower base spreading resistance will be exhibited by BBHBT 70. This is due to the fact that since the current is crowded to the edge of the base region, and hence the base contact, the average path length for a signal is reduced in the BBHBT 72 when compared with an equivalent conventional HBT. Consequently, this reduction in base resistance will result in an increased unity power gain frequency over the conventional HBT.

The foregoing discussion discloses and describes merely exemplary embodiments of the present invention. One skilled in the art will readily recognize from such discussion, and from the accompanying drawings and claims, that various changes, modification and variations can be made therein without departing from the spirit and scope of the invention as defined in the following claims.

What is claimed is:
1. A bipolar transistor comprising:
  a collector layer including at least one collector contact formed to the collector layer;
  an emitter region including at least one emitter contact formed to the emitter region;
  a base layer formed between said collector layer and said emitter region, wherein the contact between said base layer and said emitter region forms a p-n junction, said base layer including at least two separate base contacts; and current source means for applying a current to one of the base contacts, said current source means for creating a lateral current flow through the base layer causing current crowding in the base layer.

2. The bipolar transistor according to claim 1 wherein the emitter region includes a plurality of emitter layers forming an emitter mesa, said emitter mesa including an emitter graded layer in contact with the base layer, a wide band gap emitter layer formed on top of the emitter graded layer, an emitter graded contact layer formed on top of the wide band gap emitter layer and an emitter contact layer formed on top of the emitter graded contact layer, wherein the graded emitter layers are graded to form ohmic contacts between the base layer and the emitter contact layer.

3. The bipolar transistor according to claim 1 wherein the transistor is a heterojunction bipolar transistor and the base layer is formed of gallium arsenide and the emitter region is formed of aluminum gallium arsenide.

4. The bipolar transistor according to claim 2 wherein the transistor is a heterojunction bipolar transistor and the graded emitter layers are formed of aluminum gallium arsenide and the emitter contact layer is formed of gallium arsenide.

5. The bipolar transistor according to claim 1 wherein said current source means is variable for adjusting the gain of the transistor.

6. The bipolar transistor according to claim 1 wherein the two base contacts are formed on opposite sides of the emitter region, said emitter region being an emitter mesa including a plurality of separate emitter layers.

7. The bipolar transistor according to claim 6 wherein the transistor is a heterojunction bipolar transistor and the emitter layers include a plurality of graded aluminum gallium arsenide layers and a gallium arsenide layer, said gallium arsenide layer being in contact with the emitter contact, one of the graded layers being in contact with the base layer, the base layer being gallium arsenide.

* * * * *